(12) United States Patent
Takama et al.

(10) Patent No.: US 10,888,041 B2
(45) Date of Patent: Jan. 5, 2021

(54) SUBSTRATE WORKING SYSTEM AND COMPONENT MOUNTER

(71) Applicant: YAMAHA HATSUDOKI KABUSHIKI KAISHA, Iwata (JP)

(72) Inventors: Kazushi Takama, Iwata (JP); Jun Asai, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 309 days.

(21) Appl. No.: 15/767,527

(22) PCT Filed: Oct. 14, 2015

(86) PCT No.: PCT/JP2015/079065
§ 371 (c)(1),
(2) Date: Apr. 11, 2018

(87) PCT Pub. No.: WO2017/064774
PCT Pub. Date: Apr. 20, 2017

(65) Prior Publication Data
US 2018/0310446 A1 Oct. 25, 2018

(51) Int. Cl.
*H05K 13/04* (2006.01)
*H05K 13/00* (2006.01)
(Continued)

(52) U.S. Cl.
CPC ....... *H05K 13/0465* (2013.01); *H05K 13/083* (2018.08); *H05K 13/0815* (2018.08);
(Continued)

(58) Field of Classification Search
CPC .......... H05K 13/0015; H05K 13/0404; H05K 13/0408; H05K 13/0409; H05K 13/0452;
(Continued)

(56) References Cited

U.S. PATENT DOCUMENTS 6,317,972 B1   11/2001 Asai et al.
7,706,595 B2 *  4/2010 Bushman ........... H05K 13/0812
                                                          382/141
(Continued)

FOREIGN PATENT DOCUMENTS

CN     1842269 A     10/2006
JP    H04-315905 A   11/1992
(Continued)

OTHER PUBLICATIONS

Machine translation of JP 2015-095586 received from EPO website (Espacenet.com) (Year: 2015).*
(Continued)

*Primary Examiner* — Livius R. Cazan
*Assistant Examiner* — Joshua D Anderson
(74) *Attorney, Agent, or Firm* — Studebaker & Brackett PC

(57) ABSTRACT

A substrate working system includes a component mounter that mounts a component on a substrate, and an inspection unit provided in the component mounter or a device downstream of the component mounter and that performs a substrate inspection different from a normal substrate inspection when an abnormality related to a mounting operation is detected in the component mounter.

11 Claims, 4 Drawing Sheets

(51) Int. Cl.
*H05K 13/02* (2006.01)
*H05K 13/08* (2006.01)

(52) U.S. Cl.
CPC .... *Y10T 29/49131* (2015.01); *Y10T 29/53174* (2015.01); *Y10T 29/53187* (2015.01); *Y10T 29/53191* (2015.01)

(58) Field of Classification Search
CPC .. H05K 13/0465; H05K 13/08; H05K 13/081; H05K 13/0812; H05K 13/0813; H05K 13/0815; H05K 13/083; H05K 13/084; H05K 2203/163; Y10T 29/49131; Y10T 29/53174; Y10T 29/53187; Y10T 29/53191
See application file for complete search history.

(56) References Cited

U.S. PATENT DOCUMENTS

| | | | |
|---|---|---|---|
| 8,527,082 B2* | 9/2013 | Maenishi | H05K 13/0413 700/108 |
| 2005/0276464 A1* | 12/2005 | Duquette | G06K 9/00 382/151 |
| 2006/0075631 A1* | 4/2006 | Case | H05K 13/0812 29/709 |
| 2010/0224014 A1* | 9/2010 | Kaida | H05K 13/083 73/865.8 |

FOREIGN PATENT DOCUMENTS

| | | |
|---|---|---|
| JP | H05-251897 A | 9/1993 |
| JP | H06-140799 A | 5/1994 |
| JP | 2003-258500 A | 9/2003 |
| JP | 2004-327495 A | 11/2004 |
| JP | 2005-274309 A | 10/2005 |
| JP | 2007-511094 A | 4/2007 |
| JP | 2007-214460 A | 8/2007 |
| JP | 2008-098411 A | 4/2008 |
| JP | 2008-103426 A | 5/2008 |
| JP | 2008-516453 A | 5/2008 |
| JP | 2009-026973 A | 2/2009 |
| JP | 2009-130134 A | 6/2009 |
| JP | 4767995 B2 | 9/2011 |
| JP | 2013-214588 A | 10/2013 |
| JP | 2013-243273 A | 12/2013 |
| JP | 2014-093390 A | 5/2014 |
| JP | 2014-216621 A | 11/2014 |
| JP | 2015-079933 A | 4/2015 |
| JP | 2015-095586 A | 5/2015 |
| WO | 2014/024275 A1 | 2/2014 |

OTHER PUBLICATIONS

International Search Report issued in PCT/JP2015/079065; dated Jan. 19, 2016.

Written Opinion issued in PCT/JP2015/079065; dated Jan. 19, 2016.

International Preliminary Report on Patentability issued in PCT/JP2015/079065; dated Oct. 13, 2017.

An Office Action mailed by the State Intellectual Property Office of the People's Republic of China dated Aug. 2, 2019, which corresponds to Chinese Patent Application No. 201580083814.9 and is related to U.S. Appl. No. 15/767,527.

An Office Action mailed by the Japanese Patent Office dated Nov. 6, 2018, which corresponds to Japanese Patent Application No. 2017-545038 and is related to U.S. Appl. No. 15/767,527.

An Office Action mailed by the State Intellectual Property Office of the People's Republic of China dated Mar. 3, 2020, which corresponds to Chinese Patent Application No. 201580083814.9 and is related to U.S. Appl. No. 15/767,527 with English language translation.

* cited by examiner

SUBSTRATE WORKING SYSTEM AND COMPONENT MOUNTER

CROSS-REFERENCE TO RELATED APPLICATION

This application is a National Stage of International Patent Application No. PCTJP2015079065, filed Oct. 14, 2015, the entire content of which is incorporated herein by reference.

BACKGROUND

Technical Field

The present disclosure relates to a substrate working system and a component mounter.

Background Art

In general, a component mounter is known. Such a component mounter is disclosed in Japanese Patent Laying-Open No. 2015-079933, for example.

The aforementioned Japanese Patent Laying-Open No. 2015-079933 discloses a mounter (component mounter) including a transfer head that mounts a component on a substrate and an inspection device that inspects the substrate. In this mounter, the component mounting operation is stopped when an abnormality related to the mounting operation is detected.

SUMMARY

However, in the mounter (component mounter) described in the aforementioned Japanese Patent Laying-Open No. 2015-079933, the component mounting operation is stopped when the abnormality related to the mounting operation is detected, and hence there is a disadvantage that production of substrates is stopped every time the abnormality is detected. Thus, there is a problem that the substrate production efficiency is reduced.

The present disclosure has been proposed in order to solve the aforementioned problem, and an object of the present disclosure is to provide a substrate working system and a component mounter each capable of significantly reducing or preventing a reduction in substrate production efficiency.

A substrate working system according to a first aspect of the present disclosure includes a component mounter that mounts a component on a substrate and an inspection unit provided in the component mounter or a device downstream of the component mounter and that performs a substrate inspection different from a normal substrate inspection when an abnormality related to a mounting operation is detected in the component mounter. The component mounter includes an imaging portion, and the abnormality related to the mounting operation is detected based on at least one of images of a suction position before and after suction of the component captured by the imaging portion and images of a mounting position before and after mounting of the component captured by the imaging portion.

As hereinabove described, the substrate working system according to the first aspect of the present disclosure includes the inspection unit that performs the substrate inspection different from the normal substrate inspection when the abnormality related to the mounting operation is detected in the component mounter. Thus, a detailed substrate inspection can be performed by the inspection unit without stopping the mounting operation on the substrate, and hence it is possible to significantly reduce or prevent stop of production of the substrate every time the abnormality is detected. Consequently, it is possible to significantly reduce or prevent a reduction in the production efficiency of the substrate. Furthermore, when the abnormality is detected, the substrate inspection different from the normal substrate inspection is performed by the inspection unit such that it is possible to effectively significantly reduce or prevent production of the substrate with defective mounting. In addition, when the abnormality is detected, the inspection is performed by the inspection unit, and hence the user's visual confirmation can be omitted. Consequently, the user workload can be reduced, and it is possible to significantly reduce or prevent variations in inspection quality due to variations in the inspection skills of the user. A substrate working system according to a second aspect of the present disclosure includes a component mounter that mounts a component on a substrate and an inspection unit provided in the component mounter or a device downstream of the component mounter and that performs a substrate inspection different from a normal substrate inspection when an abnormality related to a mounting operation is detected in the component mounter, the component mounter includes an imaging portion, and the abnormality related to the mounting operation is detected based on at least one of images of a suction position before and after suction of the component captured by the imaging portion and images of a mounting position before and after mounting of the component captured from a plurality of directions by the imaging portion.

In the aforementioned substrate working system according to the first aspect, when the abnormality related to the mounting operation is detected in the component mounter, a more detailed substrate inspection than the normal substrate inspection is preferably performed by the inspection unit while the mounting operation is continued. According to this structure, even when the abnormality is detected, the more detailed substrate inspection than the normal substrate inspection is performed while the mounting operation is continued, and hence it is possible to more effectively significantly reduce or prevent production of the substrate with defective mounting.

In the aforementioned substrate working system according to the first aspect, when the abnormality related to the mounting operation is detected in the component mounter, the mounting operation at a location of the abnormality is preferably retried, and a more detailed substrate inspection than the normal substrate inspection is preferably performed on the substrate, on which the mounting operation at the location of the abnormality has been retried, by the inspection unit. According to this structure, the detailed substrate inspection can be performed on the substrate, on which the mounting operation at the location of the abnormality has been retried, by the inspection unit, and hence it is possible to more effectively significantly reduce or prevent production of the substrate with defective mounting. Furthermore, the detailed substrate inspection is not performed on the substrate, on which the mounting operation has not been retried, by the inspection unit, and hence it is possible to significantly reduce or prevent an increase in substrate inspection time.

In the aforementioned substrate working system according to the first aspect, the inspection unit is preferably provided in an inspection device disposed downstream of the component mounter and that inspects the substrate, and when the abnormality related to the mounting operation is detected in the component mounter, a more detailed substrate inspection than the normal substrate inspection is preferably performed by the inspection unit of the inspection device downstream of the component mounter. According to this structure, when the abnormality related to the mounting operation is detected, the detailed substrate inspection is performed by the inspection unit of the inspection device, and hence the detailed substrate inspection can be performed by the downstream inspection device while influence on the mounting operation of the component mounter is significantly reduced or prevented as much as possible.

In the aforementioned substrate working system according to the first aspect, the component mounter preferably includes a plurality of component mounters provided in series, and when the abnormality related to the mounting operation is detected in an upstream component mounter of the plurality of component mounters, a more detailed substrate inspection than the normal substrate inspection is preferably performed by the inspection unit provided in the upstream component mounter in which the abnormality has been detected or a downstream component mounter of the plurality of component mounters. According to this structure, when the abnormality related to the mounting operation is detected, the detailed substrate inspection is performed by the inspection unit of the component mounter, and hence an inspection can be performed in advance before another type of device downstream of the component mounters performs processing, and hence it is possible to significantly reduce or prevent execution of processing by another device on the substrate with defective mounting. Note that the term "series" denotes a state where a plurality of component mounters are connected to each other so as to sequentially mount components on the same substrate. That is, the term "series" indicates a concept including the case where the plurality of component mounters are disposed on a linear line, the case where the plurality of component mounters are disposed on a bent line, etc.

In the aforementioned substrate working system according to the first aspect, the component mounter preferably includes an imaging portion capable of imaging a suction operation of the component and a mounting operation of the component, and is preferably configured to detect the abnormality related to the mounting operation based on imaging by the imaging portion. According to this structure, the abnormality related to the mounting operation can be easily detected by imaging of the imaging portion.

In the aforementioned substrate working system according to the first aspect, the substrate inspection different from the normal substrate inspection preferably includes at least one of an inspection for all components of the substrate, an additional inspection for whether or not there is foreign matter in a space around the component mounted on the substrate, an additional inspection for whether or not the component is floating with respect to the substrate, and an additional inspection around where blow-off is detected when the component is blown off. According to this structure, when the abnormality related to the mounting operation is detected, the substrate inspection, as described above, different from the normal substrate inspection is performed such that it is possible to more effectively significantly reduce or prevent production of the substrate with defective mounting.

In the aforementioned substrate working system according to the first aspect, the abnormality related to the mounting operation preferably includes at least one of a suction abnormality of the component, a mounting abnormality of the component, an abnormality in which when the component is mounted, another component around the component is blown off, and an abnormality in which the component drops after suction of the component. According to this structure, when the suction abnormality of the component, the mounting abnormality of the component, the abnormality in which when the component is mounted, another component around the component is blown off, or the abnormality in which the component drops after suction of the component is detected, the substrate inspection according to the abnormality can be performed, and hence it is possible to effectively significantly reduce or prevent a reduction in the production efficiency of the substrate.

A component mounter according to a third aspect of the present disclosure includes a component mounting portion that mounts a component on a substrate, an inspection unit that performs a substrate inspection different from a normal substrate inspection when an abnormality related to a mounting operation is detected, and an imaging portion, and the abnormality related to the mounting operation is detected based on at least one of images of a suction position before and after suction of the component captured by the imaging portion and images of a mounting position before and after mounting of the component captured by the imaging portion.

As hereinabove described, the component mounter according to the third aspect of the present disclosure includes the inspection unit that performs the substrate inspection different from the normal substrate inspection when the abnormality related to the mounting operation is detected. Thus, a detailed substrate inspection can be performed by the inspection unit without stopping the mounting operation on the substrate, and hence it is possible to significantly reduce or prevent stop of production of the substrate every time the abnormality is detected. Consequently, the component mounter capable of significantly reducing or preventing a reduction in the production efficiency of the substrate can be provided. Furthermore, when the abnormality is detected, the substrate inspection different from the normal substrate inspection is performed by the inspection unit such that it is possible to effectively significantly reduce or prevent production of the substrate with defective mounting. In addition, when the abnormality is detected, the inspection is performed by the inspection unit, and hence the user's visual confirmation can be omitted. Consequently, the user workload can be reduced, and it is possible to significantly reduce or prevent variations in inspection quality due to variations in the inspection skills of the user. A component mounter according to a fourth aspect of the present disclosure includes a component mounting portion that mounts a component on a substrate, an inspection unit that performs a substrate inspection different from a normal substrate inspection when an abnormality related to a mounting operation is detected, and an imaging portion, and the abnormality related to the mounting operation is detected based on at least one of images of a suction position before and after suction of the component captured by the imaging portion and images of a mounting position before and after mounting of the component captured from a plurality of directions by the imaging portion.

According to the present disclosure, as hereinabove described, the substrate working system and the component mounter each capable of significantly reducing or preventing a reduction in substrate production efficiency can be provided.

DETAILED DESCRIPTION

An embodiment embodying the present disclosure is hereinafter described on the basis of the drawings.

First, the structure of a substrate working system 100 according to this embodiment of the present disclosure is described with reference to FIGS. 1 to 4.

(Structure of Substrate Working System)

Figure 1:
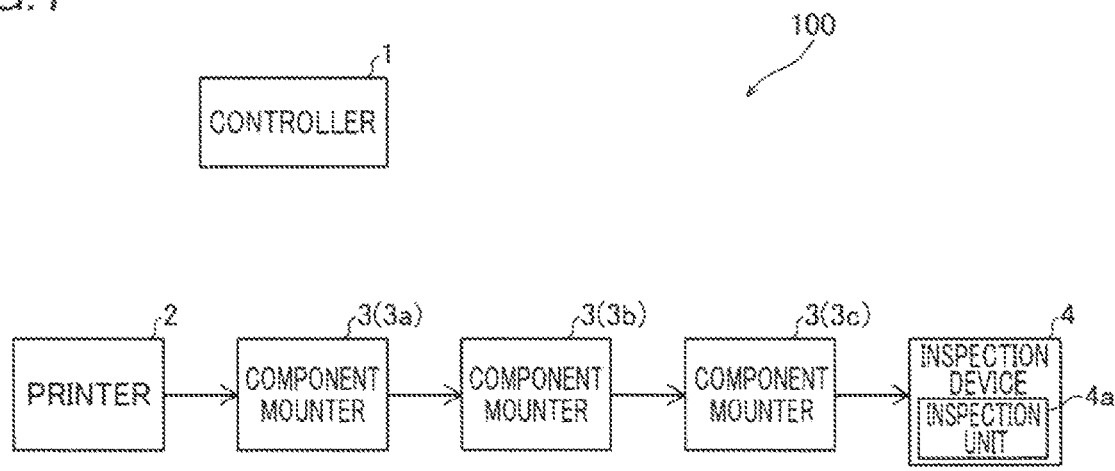
FIG. 1 is block diagram showing a substrate working system according to an embodiment of the present disclosure.

The substrate working system 100 according to this embodiment is configured to mount components E on a substrate P and to manufacture the substrate P on which the components E are mounted. The components E include small pieces of electronic components such as LSIs, ICs, transistors, capacitors, and resistors. As shown in FIG. 1, the substrate working system 100 includes a controller 1, a printer 2, component mounters 3, and an inspection device 4. A plurality of component mounters 3 (3a, 3b, 3c) are provided between the printer 2 and the inspection device 4 along a substrate production line.

In the substrate working system 100, the substrate P is conveyed from the upstream side (left side) to the downstream side (right side) along the substrate production line. Each of the devices (the printer 2, the component mounters 3, and the inspection device 4) that constitute the substrate working system 100 is a self-contained device including a control unit, and the operation of each of the devices is controlled by the control unit of each of the devices. The controller 1 has a function of controlling the entire substrate working system 100 by executing a control program (production program). In other words, the controller 1 and each of the devices transmit and receive information on a production plan as needed to produce the substrate P on which the components E are mounted in the substrate working system 100.

Next, the structure of each of the devices that constitute the substrate working system 100 is described.

The controller 1 is configured to control each of the devices of the substrate working system 100.

The printer 2 is a screen printer and has a function of applying solder paste onto a mounting surface of the substrate P. Furthermore, the printer 2 is configured to deliver the substrate P after solder printing to the downstream component mounter 3 (3a).

Figure 2:
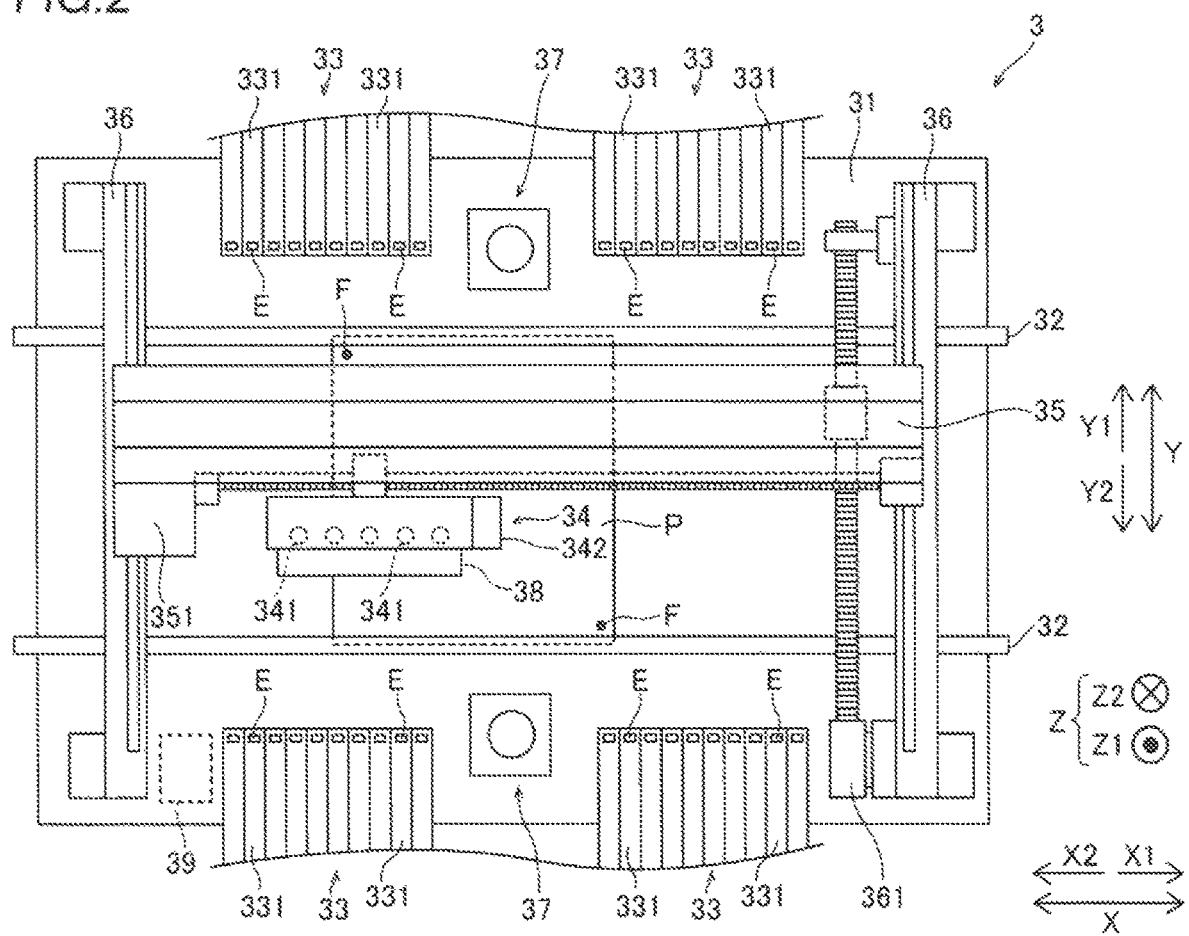
FIG. 2 is a diagram showing the overall structure of a component mounter in the substrate working system according to the embodiment of the present disclosure.

The component mounters 3 have a function of mounting the components E at predetermined mounting positions on the substrate P on which the solder paste is printed. The plurality of component mounters 3 (3a to 3c) are disposed along the conveyance direction of the substrate P. The plurality of component mounters 3 are disposed in the order of the component mounter 3a, the component mounter 3b, and the component mounter 3c from the upstream side in the conveyance direction of the substrate P. The component mounters 3a to 3c have the same structure. As shown in FIG. 2, the component mounters 3 (3a to 3c) each include a base 31, a pair of conveyors 32, component feeders 33, a head unit 34, a support 35, a pair of rails 36, component recognition imaging portions 37, an imaging unit 38, and a control unit 39. The imaging unit 38 is an example of an "imaging portion" in the claims.

The pair of conveyors 32 are installed on the base 31 and are configured to convey the substrate P in a direction X. In addition, the pair of conveyors 32 are configured to hold the substrate P being conveyed in a stopped state at a mounting operation position. Moreover, the pair of conveyors 32 are configured such that an interval therebetween in a direction Y can be adjusted according to the dimensions of the substrate P.

The component feeders 33 are disposed outside (Y1 and Y2 sides) of the pair of conveyors 32. A plurality of tape feeders 331 are disposed in the component feeders 33.

The tape feeders 331 hold reels (not shown) on which tapes that hold a plurality of components E at a predetermined interval are wound. The tape feeders 331 are configured to feed the components 31 from the tips of the tape feeders 331 by rotating the reels to feed the tapes that hold the components E.

The head unit 34 is provided so as to move between the upper side of the pair of conveyors 32 and the upper side of the component feeders 33. The head unit 34 includes a plurality of (five) mounting heads 341 including nozzles 341a (see FIG. 3) mounted at their lower ends and a substrate recognition imaging portion 342. The mounting heads 341 are examples of a "component mounting portion" in the claims, and the substrate recognition imaging portion 342 is an example of an "inspection unit" in the claims.

The mounting heads 341 are configured to be movable up and down (movable in a direction Z), and are configured to suction and hold the components E fed from the tape feeders 331 by a negative pressure generated at the tips of the nozzles 341a by a negative pressure generator (not shown) and to mount the components E at the mounting positions on the substrate P.

The substrate recognition imaging portion 342 is configured to image fiducial marks F of the substrate P in order to recognize the position and orientation of the substrate P. The positions of the fiducial marks F are imaged and recognized such that the mounting positions of the components E on the substrate P can be accurately acquired. In addition, the substrate recognition imaging portion 342 is also used as an inspection unit that performs a substrate inspection. In the substrate inspection, it is inspected whether or not the components E have been normally mounted on the substrate P. The substrate recognition imaging portion 342 is configured to image the substrate P from above (Z1 direction side) and capture an image for the substrate inspection.

The support 35 includes a motor 351. The support 35 is configured to move the head unit 34 in the direction X along the support 35 by driving the motor 351. Both ends of the support 35 are supported by the pair of rails 36.

The pair of rails 36 are fixed on the base 31. A rail 36 on an X1 side includes a motor 361. The rails 36 are configured to move the support 35 in the direction Y perpendicular to the direction X along the pair of rails 36 by driving the motor 361. The head unit 34 is movable in the direction X along the support 35, and the support 35 is movable in the direction Y along the rails 36 such that the head unit 34 is movable in the directions X and Y.

The component recognition imaging portions 37 are fixed on the upper surface of the base 31. The component recognition imaging portions 37 are disposed outside (Y1 and Y2 sides) of the pair of conveyors 32. The component recognition imaging portions 37 are configured to image the components E suctioned by the nozzles 341a of the mounting heads 341 from the lower side (Z2 side) in order to recognize the suction states (suction attitudes) of the components E prior to mounting of the components E. Thus, the control unit 39 can acquire the suction states of the components E suctioned by the nozzles 341a of the mounting heads 341.

Figure 3:
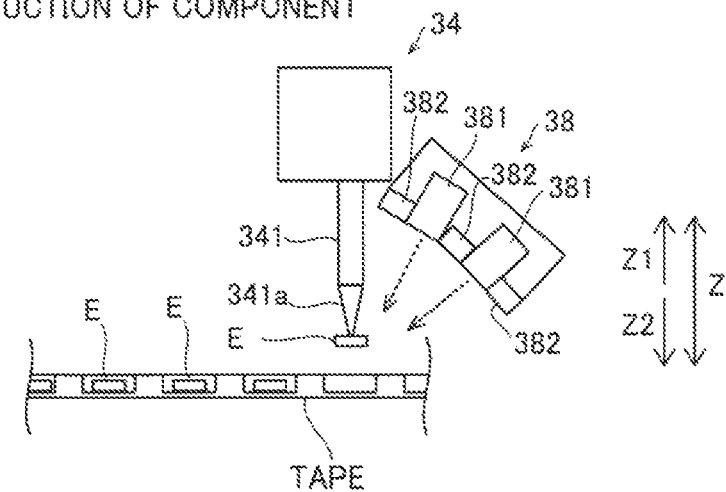
FIG. 3 is a diagram for illustrating the component suction operation of a head unit provided in the component mounter in the substrate working system according to the embodiment of the present disclosure.
Figure 4:
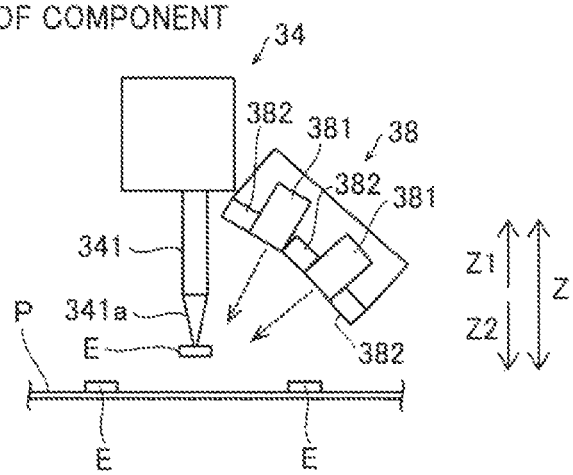
FIG. 4 is a diagram for illustrating the component mounting operation of the head unit provided in the component mounter in the substrate working system according to the embodiment of the present disclosure.

The imaging unit 38 is mounted on the head unit 34. Thus, the imaging unit 38 is configured to move in the directions X and Y together with the head unit 34 as the head unit 34 moves in the directions X and Y. As shown in FIG. 3, the imaging unit 38 is configured to image a suction position before and after suction of a component E when the component E is suctioned. As shown in FIG. 4, the imaging unit 38 is configured to image a mounting position before and after mounting of the component E when the component E is mounted.

The imaging unit 38 is also configured to capture images for measuring the height of the mounting position on the substrate P. The imaging unit 38 includes a plurality of cameras 381 and illuminators 382. Thus, the imaging unit 38 can image the suction position and the mounting position from a plurality of directions (angles). Based on the images captured by the imaging unit 38 before and after suction, suction determination of the component E is performed. Furthermore, based on the images captured by the imaging unit 38 before and after mounting, mounting determination of the component E is performed. The suction determination and the mounting determination of the component E each are performed using a difference between the preceding and succeeding images, for example.

The illuminators 382 are configured to emit light when the cameras 381 capture images. The illuminators 382 are provided around the cameras 381. The illuminators 382 each include a light source such as an LED (light-emitting diode).

The control unit 39 includes a CPU, and is configured to control the overall operation of the component mounter 3 such as an operation of conveying the substrate P performed by the pair of conveyors 32, a mounting operation performed by the head unit 34, and imaging operations performed by the component recognition imaging portions 37, the imaging unit 38, and the substrate recognition imaging portion 342.

The inspection device 4 has a function of inspecting the appearance of the substrate P with visible light or X-rays. Furthermore, the inspection device 4 is configured to receive the substrate P from the upstream component mounter 3 (3c) and inspect the substrate. Specifically, the inspection device 4 includes an inspection unit 4a that performs a substrate inspection.

According to this embodiment, the component mounter 3 (control unit 39) is configured to detect an abnormality related to the mounting operation based on imaging by the imaging unit 38. For example, as the abnormality related to the mounting operation, the control unit 39 detects a suction abnormality of the component E, a mounting abnormality of the component E, an abnormality in which when the component E is mounted, another component E around the component E is blown off, and an abnormality in which the component E drops after suction of the component E. The suction abnormality of the component E includes an abnormality in the case where a drop in the negative pressure of a nozzle 341a is detected immediately before mounting after suction of the component E. In addition, the suction abnormality of the component E includes an abnormality in the case where the component E is lost when the tip of the nozzle 341a is inspected by a side view camera (not shown) or the like immediately before mounting after suction of the component E.

When the abnormality related to the mounting operation is detected in the component mounter 3, a substrate inspection different from a normal substrate inspection is performed by the inspection unit (the substrate recognition imaging portion 342 or the inspection unit 4a). Specifically, when the abnormality related to the mounting operation is detected in the component mounter 3, a more detailed substrate inspection than the normal substrate inspection is performed by the inspection unit (the substrate recognition imaging portion 342 or the inspection unit 4a) while the mounting operation is continued.

The substrate inspection different from the normal substrate inspection includes an inspection for all the components E of the substrate P, an additional inspection for whether or not there is foreign matter in a space around the component E mounted on the substrate P, an additional inspection for whether or not the component E is floating with respect to the substrate P, and an additional inspection around where blow-off is detected when the component E is blown off. In the inspection for all the components E of the substrate P, in the case where only the large-sized component E is normally inspected, the substrate inspection is performed for all the components E when the abnormality related to the mounting operation is detected, for example. In the additional inspection for whether or not the component E is floating with respect to the substrate P, it is inspected whether or not foreign matter is caught under the large-sized component E such that the component E is floating with respect to the substrate P, for example.

In addition, when the abnormality related to the mounting operation is detected in the component mounter 3, the mounting operation at a location of the abnormality is retried, and the more detailed substrate inspection than the normal substrate inspection is performed on the substrate P, on which the mounting operation at the location of the abnormality has been retried, by the inspection unit (the substrate recognition imaging portion 342 or the inspection unit 4a).

(Description of Component Mounting Operation Examples)

Next, mounting operation control processing in the substrate working system 100 is described with reference to FIGS. 5 and 6.

Figure 5:
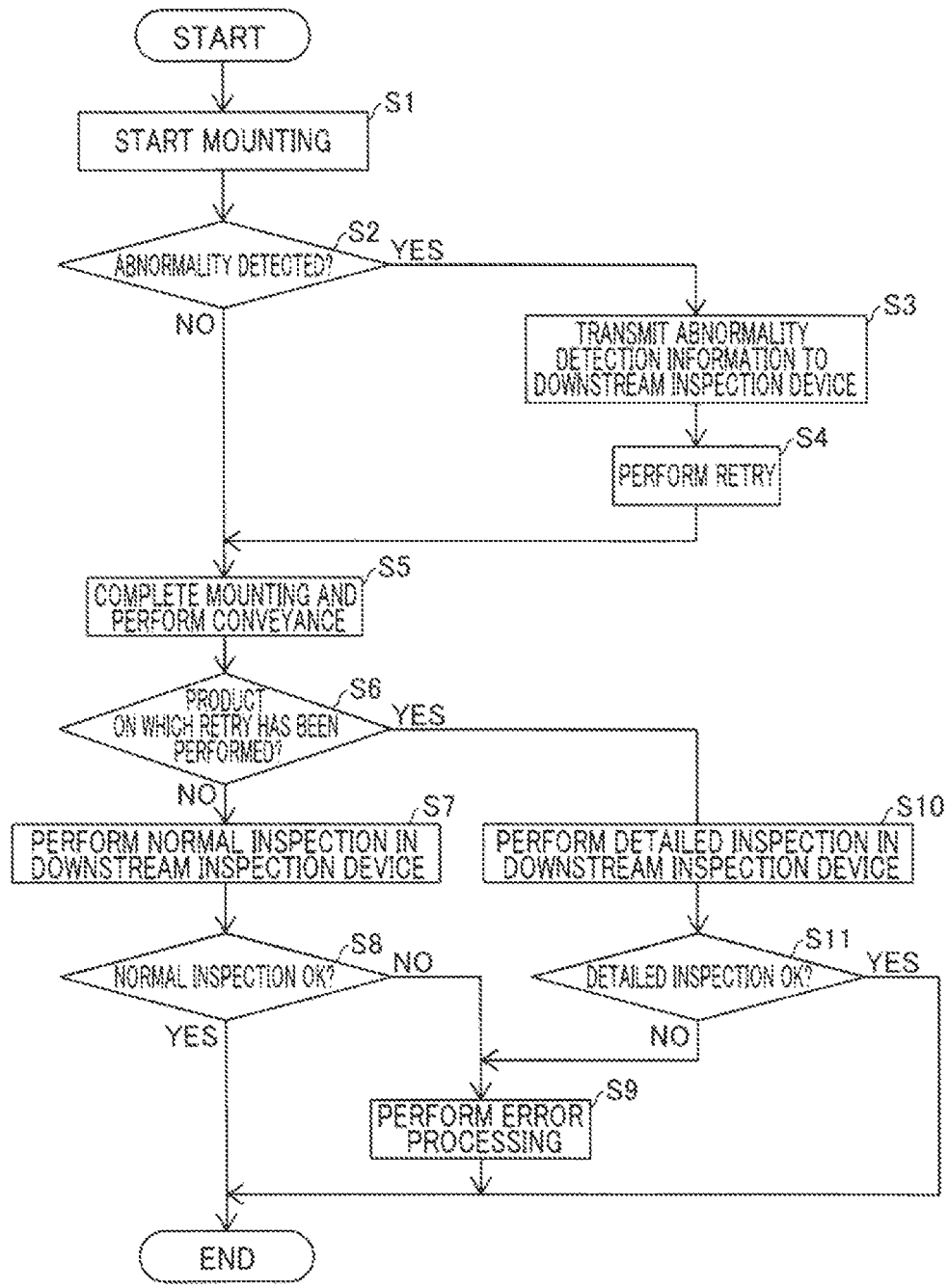
FIG. 5 is a flowchart for illustrating mounting operation control processing (first operation example) in the substrate working system according to the embodiment of the present disclosure.

In a first operation example shown in FIG. 5, when the abnormality related to the mounting operation is detected in the component mounter 3, the more detailed substrate inspection than the normal substrate inspection is performed by the inspection unit 4a of the inspection device 4 downstream of the component mounters 3.

When mounting is started in the component mounter 3 in step 51 of FIG. 5, it is determined whether or not the abnormality related to the mounting operation has been detected in the component mounter 3 in step S2. When the abnormality has been detected, the processing advances to step S3, and when no abnormality has been detected, the processing advances to step S5.

In step S3, abnormality detection information is transmitted from the upstream component mounter 3 in which the abnormality has been detected to the downstream inspection device 4. In step S4, the mounting operation is retried. Thereafter, in step S5, when mounting of all the components E to be mounted in the component mounter 3 is completed, the substrate P is conveyed.

Then, in step S6, it is determined whether or not the conveyed substrate P is a product on which the retry has been performed in the downstream inspection device 4. When the conveyed substrate P is not a product on which the retry has been performed, the processing advances to step S7, and when the conveyed substrate P is a product on which the retry has been performed, the processing advances to step S10.

In step S7, the normal substrate inspection is performed in the downstream inspection device 4. In step S8, it is determined whether or not the result of the normal substrate inspection is OK (no abnormality). When the result is OK, the mounting operation control processing is terminated. When the result is not OK, the processing advances to step S9, and error processing is performed. Thereafter, the mounting operation control processing is terminated.

When it is determined in step S6 that the conveyed substrate P is a product on which the retry has been performed, the more detailed substrate inspection than the normal substrate inspection is performed in the downstream inspection device 4 in step S10. In step S11, it is determined whether or not the result of the detailed substrate inspection is OK (no abnormality). When the result is OK, the mounting operation control processing is terminated. When the result is not OK, the processing advances to step S9, and error processing is performed. Thereafter, the mounting operation control processing is terminated.

Figure 6:
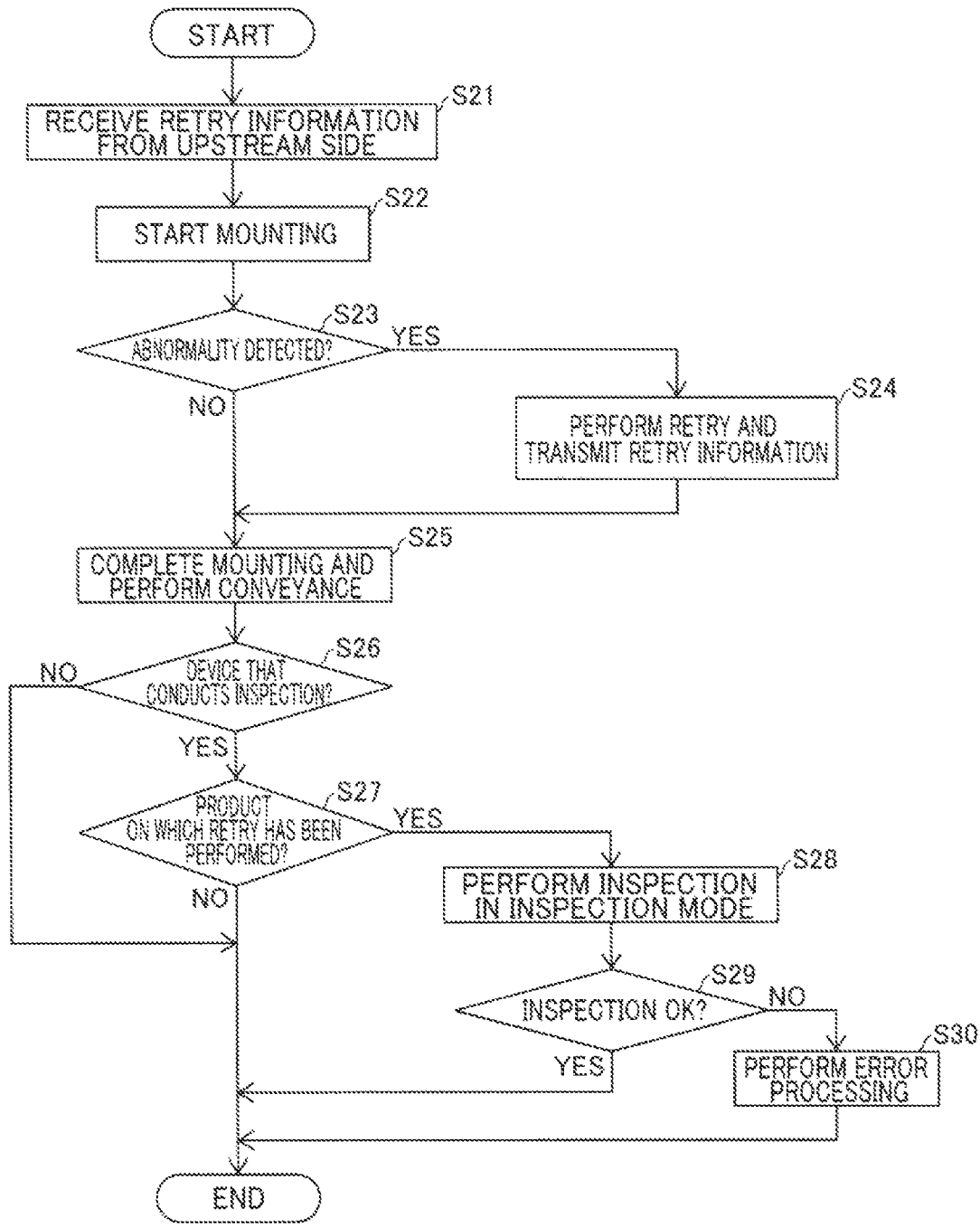
FIG. 6 is a flowchart for illustrating mounting operation control processing (second operation example) in the substrate working system according to the embodiment of the present disclosure.

In a second operation example shown in FIG. 6, when the abnormality related to the mounting operation is detected in the upstream component mounter 3, the more detailed substrate inspection than the normal substrate inspection is performed by the inspection unit (substrate recognition imaging portion 342) provided in the upstream component mounter 3 in which the abnormality has been detected or the downstream component mounter 3.

In step S21 of FIG. 6, retry information from the upstream device is received. When mounting is started in the component mounter 3 in step S22, it is determined in step S23 whether or not the abnormality related to the mounting operation has been detected in the component mounter 3. When the abnormality has been detected, the processing advances to step S24, and when no abnormality has been detected, the processing advances to step S25.

In step S24, the mounting operation is retried, and the retry information is transmitted to the downstream device. Thereafter, in step S25, when mounting of all the components E to be mounted in the component mounter 3 is completed, the substrate P is conveyed.

Then, in step S26, it is determined whether or not the device into which the substrate P has been carried is a device that conducts an inspection. When the device is a device that conducts an inspection, the processing advances to step S27. When the device is not a device that conducts an inspection, the mounting operation control processing is terminated. In step S27, it is determined whether or not the conveyed substrate P is a product on which the retry has been performed in the device (component mounter 3) that conducts an inspection. When the conveyed substrate P is not a product on which the retry has been performed, the mounting operation control processing is terminated. When the conveyed substrate P is a product on which the retry has been performed, the processing advances to step S28.

In step S28, an inspection is performed in an inspection mode in the device (component mounter 3) that conducts an inspection. In the inspection mode, the detailed substrate inspection is performed. In step S29, it is determined whether or not the result of the substrate inspection is OK (no abnormality). When the result is OK, the mounting operation control processing is terminated. When the result is not OK, the processing advances to step S30, and error processing is performed. Thereafter, the mounting operation control processing is terminated.

Effects of Embodiment

According to this embodiment, the following effects can be obtained.

According to this embodiment, as hereinabove described, the substrate working system 100 includes the inspection unit (the substrate recognition imaging portion 342 or the inspection unit 4a) that performs the substrate inspection different from the normal substrate inspection when the abnormality related to the mounting operation is detected in the component mounter 3. Thus, the detailed substrate inspection can be performed by the inspection unit (the substrate recognition imaging portion 342 or the inspection unit 4a) without stopping the mounting operation on the substrate P, and hence it is possible to significantly reduce or prevent stop of production of the substrate P every time the abnormality is detected. Consequently, it is possible to significantly reduce or prevent a reduction in the production efficiency of the substrate P. Furthermore, when the abnormality is detected, the substrate inspection different from the normal substrate inspection is performed by the inspection unit (the substrate recognition imaging portion 342 or the inspection unit 4a) such that it is possible to effectively significantly reduce or prevent production of the substrate P with defective mounting. In addition, when the abnormality is detected, the inspection is performed by the inspection unit (the substrate recognition imaging portion 342 or the inspection unit 4a), and hence the user's visual confirmation can be omitted. Consequently, the user workload can be reduced, and it is possible to significantly reduce or prevent variations in inspection quality due to variations in the inspection skills of the user.

According to this embodiment, when the abnormality related to the mounting operation is detected in the component mounter 3, the more detailed substrate inspection than the normal substrate inspection is performed by the inspection unit (the substrate recognition imaging portion 342 or the inspection unit 4a) while the mounting operation is continued. Thus, even when the abnormality is detected, the more detailed substrate inspection than the normal substrate inspection is performed while the mounting operation is continued, and hence it is possible to more effectively significantly reduce or prevent production of the substrate P with defective mounting.

According to this embodiment, when the abnormality related to the mounting operation is detected in the component mounter 3, the mounting operation at a location of the abnormality is retried, and the more detailed substrate inspection than the normal substrate inspection is performed on the substrate P, on which the mounting operation at the location of the abnormality has been retried, by the inspection unit (the substrate recognition imaging portion 342 or the inspection unit 4a). Thus, the detailed substrate inspection can be performed on the substrate P, on which the mounting operation at the location of the abnormality has been retried, by the inspection unit (the substrate recognition imaging portion 342 or the inspection unit 4a), and hence it is possible to more effectively significantly reduce or prevent production of the substrate P with defective mounting. Furthermore, the detailed substrate inspection is not performed on the substrate P, on which the mounting operation has not been retried, by the inspection unit (the substrate recognition imaging portion 342 or the inspection unit 4a), and hence it is possible to significantly reduce or prevent an increase in substrate inspection time.

According to this embodiment, the inspection unit 4a is provided in the inspection device 4 disposed downstream of the component mounters 3 and that inspects the substrate P, and when the abnormality related to the mounting operation is detected in the component mounter 3, the more detailed substrate inspection than the normal substrate inspection is performed by the inspection unit 4a of the inspection device 4 downstream of the component mounters 3. Thus, when the abnormality related to the mounting operation is detected, the detailed substrate inspection is performed by the inspection unit 4a of the inspection device 4, and hence the detailed substrate inspection can be performed by the downstream inspection device 4 while influence on the mounting operation of the component mounters 3 is significantly reduced or prevented as much as possible.

According to this embodiment, the plurality of component mounters 3 are provided in series, and when the abnormality related to the mounting operation is detected in the upstream component mounter 3, the more detailed substrate inspection than the normal substrate inspection is performed by the inspection unit (substrate recognition imaging portion 342) provided in the upstream component mounter 3 in which the abnormality has been detected or the downstream component mounter 3. Thus, when the abnormality related to the mounting operation is detected, the detailed substrate inspection is performed by the inspection unit (substrate recognition imaging portion 342) of the component mounter 3, and hence an inspection can be performed in advance before another type of device downstream of the component mounters 3 performs processing, and hence it is possible to significantly reduce or prevent execution of processing by another device on the substrate P with defective mounting.

According to this embodiment, the component mounter 3 includes the imaging unit 38 capable of imaging the component E suction operation and the component E mounting operation, and is configured to detect the abnormality related to the mounting operation based on imaging by the imaging unit 38. Thus, the abnormality related to the mounting operation can be easily detected by imaging of the imaging unit 38.

According to this embodiment, the substrate inspection different from the normal substrate inspection includes the inspection for all the components E of the substrate P, the additional inspection for whether or not there is foreign matter in the space around the component E mounted on the substrate P, the additional inspection for whether or not the component E is floating with respect to the substrate P, and the additional inspection around where blow-off is detected when the component E is blown off. Thus, when the abnormality related to the mounting operation is detected, the substrate inspection, as described above, different from the normal substrate inspection is performed such that it is possible to more effectively significantly reduce or prevent production of the substrate P with defective mounting.

According to this embodiment, the abnormality related to the mounting operation includes the suction abnormality of the component E, the mounting abnormality of the component E, the abnormality in which when the component E is mounted, another component E around the component E is blown off, and the abnormality in which the component E drops after suction of the component E. Thus, when the suction abnormality of the component E, the mounting abnormality of the component E, the abnormality in which when the component E is mounted, another component E around the component E is blown off, or the abnormality in which the component E drops after suction of the component E is detected, the substrate inspection according to the abnormality can be performed, and hence it is possible to effectively significantly reduce or prevent a reduction in the production efficiency of the substrate P.

(Modifications)

The embodiment disclosed this time must be considered as illustrative in all points and not restrictive. The range of the present disclosure is shown not by the above description of the embodiment but by the scope of claims for patent, and all modifications within the meaning and range equivalent to the scope of claims for patent are further included.

For example, while the example in which the inspection unit that performs the substrate inspection different from the normal substrate inspection when the abnormality related to the mounting operation is detected is provided in both the component mounters and the inspection device has been shown in the aforementioned embodiment, the present disclosure is not restricted to this. According to the present disclosure, the inspection unit that performs the substrate inspection different from the normal substrate inspection when the abnormality related to the mounting operation is detected may be provided in either the component mounters or the inspection device. Alternatively, the inspection unit may be provided in a device other than the component mounters or the inspection device.

While the example in which the substrate inspection different from the normal substrate inspection includes the inspection for all the components of the substrate, the additional inspection for whether or not there is foreign matter in the space around the component mounted on the substrate, the additional inspection for whether or not the component is floating with respect to the substrate, and the additional inspection around where blow-off is detected when the component E is blown off has been shown in the aforementioned embodiment, the present disclosure is not restricted to this. According to the present disclosure, the substrate inspection different from the normal substrate inspection may include at least one of the inspection for all the components of the substrate, the additional inspection for whether or not there is foreign matter in the space around the component mounted on the substrate, the additional inspection for whether or not the component is floating with respect to the substrate, and the additional inspection around where blow-off is detected when the component E is blown off. Alternatively, the substrate inspection different from the normal substrate inspection may include an inspection other than the above.

While the example in which the abnormality related to the mounting operation includes the suction abnormality of the component, the mounting abnormality of the component, the abnormality in which when the component is mounted, another component around the component is blown off, and the abnormality in which the component drops after suction of the component has been shown in the aforementioned embodiment, the present disclosure is not restricted to this. According to the present disclosure, the abnormality related to the mounting operation may include at least one of the suction abnormality of the component, the mounting abnormality of the component, the abnormality in which when the component is mounted, another component around the component is blown off, and the abnormality in which the component drops after suction of the component. Alternatively, the abnormality related to the mounting operation may include an abnormality other than the above.

While the example in which the substrate working system includes the inspection device has been shown in the aforementioned embodiment, the present disclosure is not restricted to this. According to the present disclosure, the substrate working system may not include the inspection device. In this case, the inspection unit may be provided in the component mounters.

While the example in which the controller is provided in the substrate working system has been shown in the aforementioned embodiment, the present disclosure is not restricted to this. According to the present disclosure, work processing of the substrate may be controlled by the control unit of each of the plurality of devices.

While the example in which the three component mounters are provided in the substrate working system has been shown in the aforementioned embodiment, the present disclosure is not restricted to this. According to the present disclosure, two or less or four or more component mounters may be provided in the substrate working system.

While the mounting operation control processing is described, using the flow described in a manner driven by a flow in which processing is performed in order along a processing flow for the convenience of illustration in the aforementioned embodiment, the present disclosure is not restricted to this. According to the present disclosure, the mounting operation control processing may be performed in an event-driven manner in which processing is performed on an event basis. In this case, the processing may be performed in a complete event-driven manner or in a combination of an event-driven manner and a manner driven by a flow.

What is claimed is:

1. A substrate working system comprising:
   a component mounter configured to mount a component on a substrate with at least one previously mounted another component mounted on the substrate, wherein the component mounter includes an imager configured to perform a normal substrate inspection to detect an abnormality related to a mounting operation of the component captured by the imager, wherein the imager is configured to detect the abnormality in an area of the substrate around the component mounted by the component mounter based on blow-off of the previously mounted another component produced by a suction nozzle of the component mounter during the mounting operation of the component;
   an inspection device provided in the component mounter or downstream of the component mounter, and configured to perform an additional abnormality substrate inspection, different from the normal substrate inspection and a more detailed substrate inspection than the normal substrate inspection, when an abnormality related to a mounting operation is detected in the component mounter; and
   a controller configured to control the inspection device to perform the additionally abnormality substrate inspection when the abnormality of the previously mounted another component is blown-off during mounting of the component is detected by the imager and control the inspection device to not perform the additional abnormality substrate inspection when the imager does not detect blow-off of the previously mounted another component during the mounting operation of the component.

2. The substrate working system according to claim 1, wherein: the controller is configured to control the inspection device such that when the abnormality related to the mounting operation is detected in the component mounter, the additional abnormality substrate inspection is performed by the inspection device while the mounting operation is continued.

3. The substrate working system according to claim 1, wherein: the controller is configured to control the inspection device such that when the abnormality related to the mounting operation is detected in the component mounter, the mounting operation at a location of the abnormality is retried, and the additional abnormality substrate inspection is performed on the substrate, on which the mounting operation at the location of the abnormality has been retried, by the inspection device.

4. The substrate working system according to claim 1, wherein: the inspection device is provided downstream of the component mounter and inspects the substrate, and the controller is configured to control the inspection device such that when the abnormality related to the mounting operation is detected in the component mounter, the additional abnormality substrate is performed by the inspection device downstream of the component mounter.

5. The substrate working system according to claim 1, wherein: the component mounter includes a plurality of component mounters provided in series, and the controller is configured to control the inspection device such that when the abnormality related to the mounting operation is detected in an upstream component mounter of the plurality of component mounters, the additional abnormality substrate is performed by the inspection device provided in the upstream component mounter in which the abnormality has been detected or in a downstream component mounter of the plurality of component mounters.

6. The substrate working system according to claim 1, wherein:
   the componenet mounter includes the imager configured to image a suction operation of the component and a mounting operation of the component, and is configured to detect the abnormality related to the mounting operation based on imaging by the imager.

7. The substrate working system according to claim 1, wherein: the additional abnormality substrate inspection further includes at least one of an inspection for all components of the substrate, and an additional inspection for whether or not the component is floating with respect to the substrate.

8. The substrate working system according to claim 1, wherein: the abnormality related to the mounting operation additionally includes at least one of a suction abnormality of the component, a mounting abnormality of the component, and an abnormality in which the component drops after suction of the component.

9. A component mounter comprising:
   a mounter configured to mount a component on a substrate with at least one previously mounted another component mounted on the substrate, wherein the component mounter includes an imager configured to perform a normal substrate inspection to detect an abnormality related to a mounting operation of the component based on images of a mounting position before and after mounting of the component captured by the imager, wherein the imager is configured to detect the abnormality in an area of the substrate around the component mounted by the component mounter based on blow-off of the previously mounted another component produced by a suction nozzle of the component mounter during the mounting operation of the component;

an inspection device configured to perform an additional abnormality substrate inspection, different from the normal substrate inspection and a more detailed substrate inspection than the normal substrate inspection, when an abnormality related to a mounting operation is detected; and a controller configured to control the inspection device to perform the additional abnormality substrate inspection when the abnormality of the previously mounted another component is blown-off during mounting of the component is detected by the imager and control the inspection device to not perform the additional abnormality substrate inspection when the imager does not detect blow-off of the previously mounted another component during the mounting operation of the component.

10. A component mounter comprising:

a mounter configured to mount a component on a substrate with at least one previously mounted another component mounted on the substrate, wherein the component mounter includes an imager configured to perform a normal substrate, wherein the component mounter includes an imager configured to perform a normal substrate inspection to detect an abnormality related to a mounting operation of the component based on images of a mounting position from a plurality of directions before and after mounting of the component captured by the imager, wherein the imager is configured to detect the abnormality in an area of the substrate around the component mounted by the component mounter based on blow-off of the previously mounted another component produced by a suction nozzle of the component mounter operation of the component;

an inspection device configured to perform an additional abnormality substrate inspection, different from the normal substrate inspection and a more detailed substrate inspection than the normal substrate inspection, when an abnormality related to a mounting operation is detected; and a controller configured to control the inspection device to perform the additional abnormality substrate inspection when the abnormality of the previously mounted another component is blown-off during mounting of the component is detected by the imager and control the inspection device to not perform the additional abnormality substrate inspection when the imager does not detect blow-off of the previously mounted another component during the mounting operation of the component.

11. A substrate working system comprising:

a component mounter configured to mount a component on a substrate with at least one previously mounted another component mounted on the substrate, wherein the component mounter includes an imager configured to perform a normal substrate inspection to detect an abnormality related to a mounting operation of the component based on images of a mounting position from a plurality of directions before and after mounting of the component captured by the imager, wherein the imager is configured to detect the abnormality in an area of the substrate around the component mounted by the component mounter based on blow-off of the previously mounted another component produced by a suction nozzle of the component mounter during the mounting operation of the component; and an inspection device, provided in the component mounter or downstream of the component mounter, and configured to perform an additional abnormality substrate inspection, different from the normal substrate inspection and a more detailed substrate inspection than the normal substrate inspection, when an abnormality related to a mounting operation is detected in the component mounter; and a controller configured to control the inspection device to perform the additional abnormality substrate inspection when the abnormality of the previously mounted another component is blown-off during mounting of the component is detected by the imager and control the inspection device to not perform the additional substrate abnormality inspection when the imager does not detect blow-off of the previously mounted another component during the mounting operation of the component.

* * * * *